(12) United States Patent
Abe

(10) Patent No.: US 9,381,652 B2
(45) Date of Patent: Jul. 5, 2016

(54) NON-CONTACT TRANSFER HAND

(71) Applicant: TOYOTA JIDOSHA KABUSHIKI KAISHA, Toyota-shi (JP)

(72) Inventor: Nobuhira Abe, Miyoshi (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/692,931

(22) Filed: Apr. 22, 2015

(65) Prior Publication Data

US 2015/0306774 A1    Oct. 29, 2015

(30) Foreign Application Priority Data

Apr. 25, 2014   (JP) ................................ 2014-091344

(51) Int. Cl.
*B25J 15/06*      (2006.01)
*H01L 21/683*      (2006.01)

(52) U.S. Cl.
CPC ......... *B25J 15/0616* (2013.01); *H01L 21/6838* (2013.01)

(58) Field of Classification Search
USPC ........................ 294/213, 64.2, 64.3; 269/21
See application file for complete search history.

(56) References Cited

U.S. PATENT DOCUMENTS

| | | | | |
|---|---|---|---|---|
| 3,438,668 A * | 4/1969 | Williams | ............... | B66C 1/0212 251/342 |
| 3,523,706 A * | 8/1970 | Logue | ................... | B65G 47/911 294/64.3 |
| 3,539,216 A * | 11/1970 | Forcier | ................. | B65G 47/911 271/97 |
| 3,993,301 A * | 11/1976 | Vits | ...................... | B65H 3/0808 271/98 |
| 4,566,726 A * | 1/1986 | Correnti | ................ | B66C 1/0268 294/64.3 |
| 4,773,687 A * | 9/1988 | Bush | ..................... | B25J 15/0616 294/64.3 |
| 5,169,196 A * | 12/1992 | Safabakhsh | ........ | H05K 13/0408 271/97 |
| 6,099,056 A * | 8/2000 | Siniaguine | .......... | H01L 21/6838 294/188 |
| 6,244,641 B1 * | 6/2001 | Szapucki | ............. | B25J 15/0616 294/188 |
| 6,578,891 B1 * | 6/2003 | Suzuki | ................... | B25J 13/086 294/185 |
| 7,104,578 B2 * | 9/2006 | Hartog | .............. | H01L 21/67383 294/183 |
| 7,823,941 B2 * | 11/2010 | Caldwell | ............. | B65G 47/911 294/64.3 |
| 2005/0088003 A1 * | 4/2005 | Halpin | .............. | H01L 21/68707 294/64.3 |
| 2011/0156331 A1 | 6/2011 | Harada et al. | | |

FOREIGN PATENT DOCUMENTS

| | | |
|---|---|---|
| JP | 08-503680 | 4/1996 |
| JP | 10-000583 | 1/1998 |
| JP | 2005-251948 | 9/2005 |
| JP | 2007-324442 | 12/2007 |
| JP | 2009-032744 | 2/2009 |
| JP | 2011-199158 | 10/2011 |
| JP | 2013-094949 | 5/2013 |
| JP | 2013-152974 | 8/2013 |

* cited by examiner

*Primary Examiner* — Paul T Chin
(74) *Attorney, Agent, or Firm* — Oblon, McClelland, Maier & Neustadt, L.L.P

(57) ABSTRACT

A non-contact transfer hand includes a suction holding plate and a lid portion. The suction holding plate has a flat-shaped suction surface as a front surface, a non-suction surface as a back surface, and a chamber. The suction surface has a gas discharge groove. The non-suction surface has a gas supply groove that has a gas introduction port. The chamber communicates with an end of the gas supply groove. A wall surface of the chamber has an inlet. The gas supply groove is configured to supply gas from the gas introduction port toward the chamber. The gas discharge groove communicates with the chamber via the inlet, and is configured to discharge the gas in a direction apart from the chamber. The lid portion is fixed on the non-suction surface to cover the gas supply groove and the chamber.

9 Claims, 5 Drawing Sheets

NON-CONTACT TRANSFER HAND

INCORPORATION BY REFERENCE

The disclosure of Japanese Patent Application No. 2014-091344 filed on Apr. 25, 2014 including the specification, drawings and abstract is incorporated herein by reference in its entirety.

BACKGROUND OF THE INVENTION

1. Field of the Invention

The invention relates to a non-contact transfer hand.

2. Description of Related Art

A technique regarding a non-contact transfer hand is disclosed in Japanese Patent Application Publication No. 2009-032744 (JP 2009-032744 A). A Bernoulli chuck (a non-contact transfer hand) described in JP 2009-032744 has a configuration in which a grip unit is coupled to a disc-shaped suction holding plate. In this suction holding plate, a suction surface for holding a workpiece has four air discharge grooves that are located on an outer peripheral side of the suction holding plate. An outer end and a suction surface side of each of the air discharge grooves are opened. In addition, a compressed air supply passage and a distribution flow passage are bored in the suction holding plate. The compressed air supply passage is communicated with a discharge pump. The distribution flow passage communicates between the compressed air supply passage and the four air discharge grooves. The air supplied from the grip unit flows through the compressed air supply passage and the distribution flow passage that are formed in the suction holding plate, and is discharged from the air discharge grooves. The compressed air that is discharged from the air discharge groove draws peripheral air by an ejector effect and thus generates a suction force to suck the workpiece over the suction surface. In addition, since the compressed air flows through the air discharge groove at a high speed, negative pressure is generated around the air discharge groove by Bernoulli effect. In this way, the workpiece is sucked over the suction surface.

In the case where the compressed air supply passage and the distribution flow passage are formed in the above-described non-contact transfer hand in the related art, a long narrow hole has to be formed in the suction holding plate by drilling. In order to form the long narrow hole by drilling, a drill needs to have a small diameter. However, reduction in diameter of the drill is not preferable when breaking or bending of the drill during a process is taken into consideration. As a result, it is difficult to form the hole with a small diameter. For this reason, in the related art, it is difficult to reduce a thickness of the suction holding plate.

SUMMARY OF THE INVENTION

The invention provides a non-contact transfer hand.

A non-contact transfer hand according to an aspect of the invention includes a suction holding plate and a lid portion. The suction holding plate has a flat-shaped suction surface as a front surface, a non-suction surface as a back surface, and a chamber. The suction surface has a gas discharge groove. The non-suction surface has a gas supply groove that has a gas introduction port. The chamber communicates with an end of the gas supply groove. The gas supply groove is configured to supply gas from the gas introduction port toward the chamber. A wall surface of the chamber has an inlet. The gas discharge groove communicates with the chamber via the inlet, and is configured to discharge the gas in a direction apart from the chamber. The lid portion is fixed on the non-suction surface to cover the gas supply groove and the chamber.

According to the aspect of the invention, a gas flow passage can be formed by grooving the suction surface and the non-suction surface. Thus, for example, even when the flow passage is a shallow passage that has a depth of 1 mm or smaller, the flow passage can easily be formed in comparison with a flow passage formed by hole processing. Just as described, a groove depth can easily be reduced, and thus thinning of the suction holding plate can easily be achieved. Then, the flow passage is formed by covering opening sides of the gas discharge groove and the chamber with the lid portion.

In the aspect of the invention, the gas discharge groove may be constituted by a plurality of gas discharge grooves. In addition, the gas discharge grooves may be arranged symmetrically with respect to a plane perpendicular to the suction surface. By adopting such a configuration, stable suction performance can easily be attained.

In the aspect of the invention, the gas supply groove may have a linear shape. In addition, the chamber may be provided at a center of the suction surface. Furthermore, the gas discharge grooves may extend radially and linearly from the chamber. This configuration can easily prevent the gas discharge groove on the suction surface side and the gas supply groove on the non-suction surface side of the suction holding plate from crossing each other in a plan view (when the suction holding plate is seen from the suction surface side or the non-suction surface side). Therefore, thinning of the suction holding plate can easily be achieved. Moreover, the lengths of the gas discharge grooves can easily be made equal to each other by arranging the chamber at the center of the suction surface. Therefore, stable suction performance can be attained.

In the aspect of the invention, the gas supply groove may have a main groove and a width reduction groove. The main groove may have a constant width and extend linearly. The width reduction groove may extend from an end of the main groove to the chamber. In addition, a groove width of the width reduction groove may gradually be reduced toward the chamber. When such a width reduction groove is adopted, the inlet of the gas discharge groove can be arranged in the vicinity of the outlet of the gas supply groove. In this way, the number of the inlet of the gas discharge groove can easily be increased. In addition, the inlets of the gas discharge groove can easily be arranged at equally spaced intervals.

In addition, the non-contact transfer hand according to the aspect of the invention may further include a projection that is provided on a bottom surface of the chamber. It is possible by adopting such a configuration to easily equalize pressure distribution in the chamber by the projection and thus to improve uniformity of a flow rate of the gas that is discharged from the gas discharge groove.

According to the aspect of the invention, thinning of the suction holding plate can easily be carried out.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A detailed description will hereinafter be made on preferred embodiments of a non-contact transfer hand according to the invention with reference to the drawings. The embodiments of the invention particularly relate to a non-contact transfer hand that is used to suck a workpiece having a flat plate shape, such as a semiconductor wafer and a glass substrate, over a suction surface in a non-contact state and transfer the workpiece to a specified location.

Figure 1:
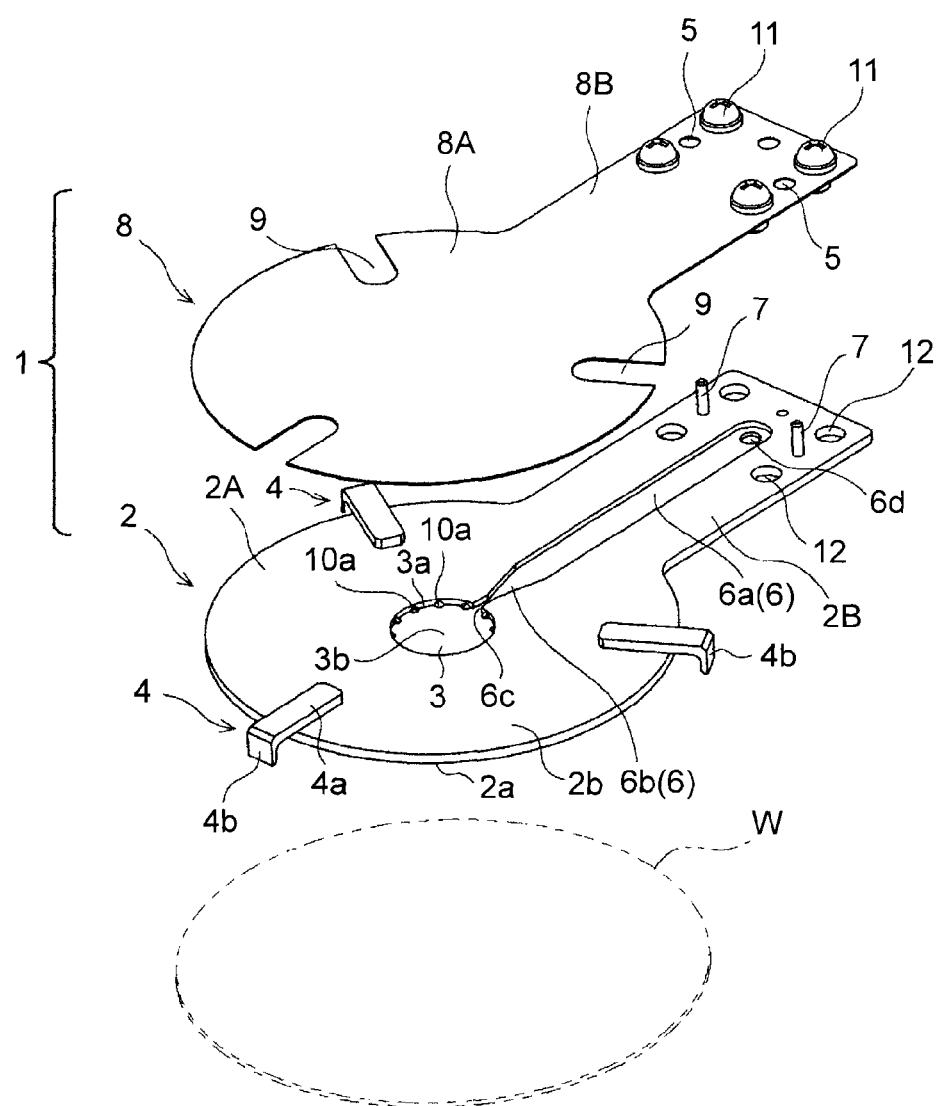
FIG. 1 is an exploded perspective view of an embodiment of a non-contact transfer hand according to the invention.
Figure 2:
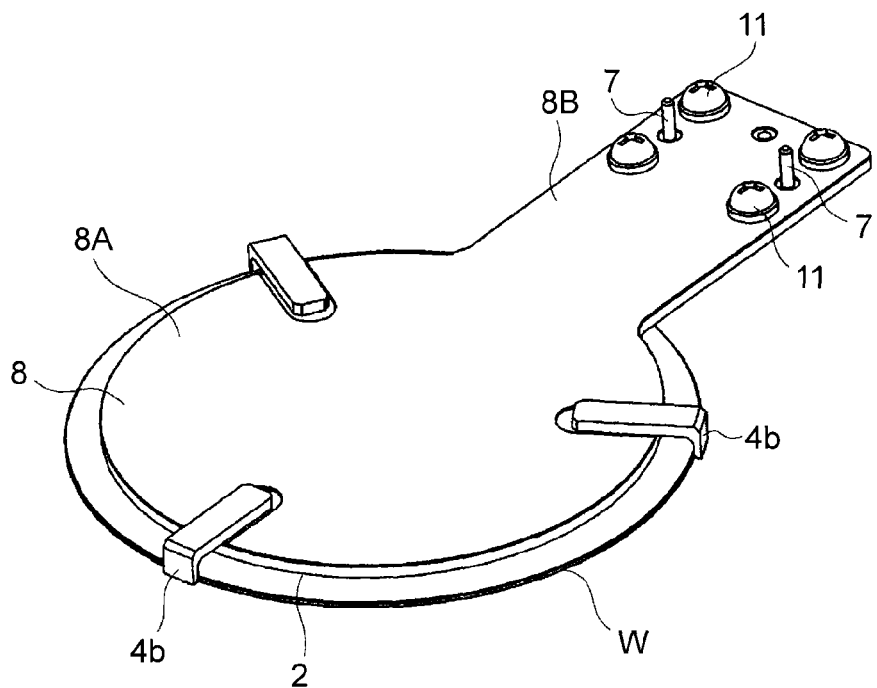
FIG. 2 is a perspective view of a state that a wafer is sucked over the hand shown in FIG. 1.
Figure 3:
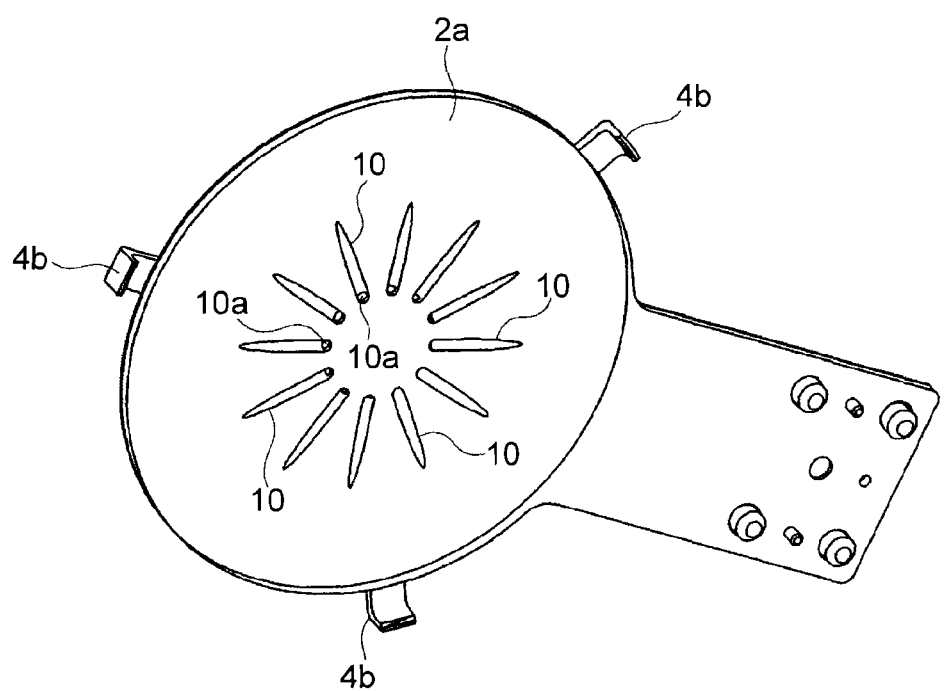
FIG. 3 is a perspective view of a suction surface side of the hand.

As shown in FIG. 1 to FIG. 3, a non-contact transfer hand 1 is mounted to a transfer robot in a microminiature semiconductor facility and used to transfer a thin flat workpiece W. The hand 1 is equipped with a suction holding plate 2 that has a thickness of approximately 1.5 mm and that has a flat-shaped suction surface 2a. The suction holding plate 2 that is made of a resin or a metal has: a circular suction main portion 2A that is slightly smaller than the workpiece (the semiconductor wafer, the glass substrate, or the like, for example) W that has a flat plate shape and is subject to be sucked; and a rectangular extended portion 2B that is radially projected from a peripheral edge of the suction main portion 2A on the same plane.

A circular chamber 3 in a recessed shape is provided at the center of the suction main portion 2A. Workpiece holding claws 4 are fixed to the suction main portion 2A at equally spaced intervals. Each of the L-shaped workpiece holding claws 4 have: a fixed portion 4a that is fixed to a non-suction surface 2b of the suction main portion 2A; and a claw portion 4b that is formed by bending an end of the fixed portion 4a at a right angle. The workpiece W can reliably be positioned with respect to the suction main portion 2A since the claw portion 4b abuts against a peripheral edge of the workpiece W.

The non-suction surface 2b of the suction holding plate 2 has a linear gas supply groove 6 that extends from the extended portion 2B across the suction main portion 2A. A terminating end of the gas supply groove 6 has a recessed shape and is supplied with the gas from outward to inward. The terminating end of the gas supply groove 6 is communicated with the circular chamber 3. Meanwhile, a starting end of the gas supply groove 6 is communicated with an outside air supply source (not shown) via a gas introduction hole 6d. Furthermore, positioning pins 7 are provided on the non-suction surface 2b side of the extended portion 2B in the suction holding plate 2. As shown in FIG. 1, the gas supply groove 6 is provided between the positioning pins 7.

A plate-shaped lid portion 8 is mounted on the non-suction surface 2b of the suction holding plate 2 so as to cover the chamber 3 and the gas supply groove 6. An outer shape of the lid portion 8 that is made of a resin or a metal is substantially the same as an outer shape of the suction holding plate 2. The lid portion 8 includes: a lid main body portion 8A, an outer shape of which is substantially the same as an outer shape of the suction main portion 2A; and an extended portion 8B, an outer shape of which is substantially the same as an outer shape of the extended portion 2B. The lid main body portion 8A has notches 9, in each of which the fixed portion 4a of the workpiece holding claw 4 is inserted. In addition, the extended portion 8B has positioning holes 5, through which each of the positioning pin 7 is inserted. Then, the lid portion 8 is fixed to the non-suction surface 2b of the suction holding plate 2 by screwing a screw 11 in a screw hole 12 that is formed in the suction holding plate 2.

Figure 4:
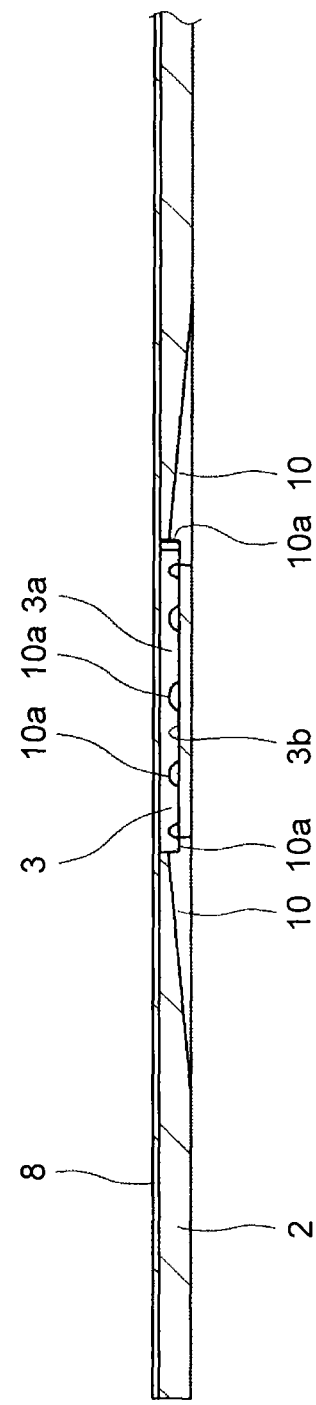
FIG. 4 is an enlarged cross-sectional view of main sections of the hand.

As shown in FIG. 3 and FIG. 4, the suction surface 2a of the suction holding plate 2 has gas discharge grooves 10 in a radial fashion. Each of the gas discharge grooves 10 has a recessed shape, and the air in the chamber 3 is discharged to the outside from the gas discharge grooves 10. An inlet 10a of the gas discharge groove 10 is formed across a circular peripheral wall surface 3a and a bottom surface 3b that form the chamber 3. The gas discharge groove 10 is formed on the suction surface 2a side by a process using a ball end mill that has a spherical tip. The gas discharge groove 10 is formed such that it becomes shallower and is tapered radially outward from the inlet 10a. Since the gas discharge groove 10 is formed in such a shape, the air can smoothly flow outward from the gas discharge groove 10 in a manner to follow the suction surface 2a. In this way, when the air flows through a gap between the suction surface 2a and the workpiece W at the high speed, the workpiece W can efficiently be sucked over the suction surface 2a of the suction holding plate 2 due to a negative pressure generating action of Bernoulli effect.

Upon forming of the gas discharge groove 10, first, the inlet 10a is formed in the chamber 3 from the suction surface 2a of the suction holding plate 2 by using the ball end mill. Then, the ball end mill is moved in a radial direction of the suction surface 2a such that the groove becomes gradually shallower from the inlet 10a. With such forming, the gas discharge groove 10 can easily be processed. Thus, processing time is short.

The gas discharge grooves 10 are arranged symmetrically with respect to a surface perpendicular to the suction surface 2a. As a result of such arrangement, stable suction performance for the workpiece W can easily be attained. Here, the gas discharge grooves 10 extend linearly and are formed radially from the chamber 3 that is arranged at the center of the suction surface 2a. The gas discharge grooves 10 are arranged at equally spaced intervals in a circumferential direction of the chamber 3.

As described above, the gas discharge grooves 10 are formed linearly and radially. This configuration can easily prevent the gas supply groove 6 on the non-suction surface 2b side and the gas discharge groove 10 on the suction surface 2a side from crossing each other in a plan view (when the suction holding plate 2 is seen from the suction surface 2a side or the non-suction surface 2b side). In this way, thinning of the suction holding plate 2 can easily be achieved. In addition, a weight of the suction holding plate 2 can be reduced simultaneously. Furthermore, since the chamber 3 is arranged at the center of the suction surface 2a, the gas discharge grooves 10 can easily have the same length. In this way, the stable suction performance can be attained.

As shown in FIG. 1, the gas supply groove 6 that extends linearly has: a main groove 6a that extends while a width thereof remains the same; and a width reduction groove 6b that extends from a downstream end of the main groove 6a to the chamber 3. A groove width of the width reduction groove 6b is gradually reduced toward a downstream side. Although pressure is lost in this width reduction groove 6b, the pressure loss can be suppressed by reducing an overall length of this width reduction groove 6b and adopting a tapered shape for the width reduction groove 6b. When such a width reduction groove 6b is adopted, the inlet 10a of the gas discharge groove 10 can be arranged in the vicinity of an outlet 6c of the gas supply groove 6. In this way, the number of the inlet 10a of the gas discharge groove 10 can easily be increased in the chamber 3. In addition, the inlets 10a of the gas discharge grooves 10 can easily be arranged at equally spaced intervals in the circumferential direction along the peripheral wall surface 3a.

As described above, the suction holding plate 2 of the non-contact transfer hand 1 has: the gas supply groove 6 in the recessed shape and the chamber 3 in the recessed shape on the non-suction surface 2b side and; the gas discharge groove 10 in the recessed shape on the suction surface 2a side. In such a configuration, a gas flow passage can be formed when the suction surface 2a and the non-suction surface 2b are subject to grooving. Thus, for example, even when the flow passage has a depth of 1 mm or smaller and thus is shallow, the flow passage can easily be formed in comparison with a flow passage formed by hole processing. Just as described, a groove depth can easily be reduced, and thus the thinning of the suction holding plate 2 can easily be achieved. Then, the flow passage is formed when the lid portion 8 covers opening sides of the gas discharge grooves 10 and the chamber 3.

Furthermore, in the plan view (when the suction holding plate 2 is seen from the suction surface 2a side or the non-suction surface 2b side), the gas supply groove 6, the chamber 3, and the gas discharge grooves 10 neither overlap nor cross each other. As a result, thinning of the suction holding plate 2 can further be achieved easily. Such thinning contributes to the weight reduction of the suction holding plate 2.

The invention is not limited to the above-described embodiment, and various modifications as described below can be made without departing from the gist of the invention.

Figure 5:
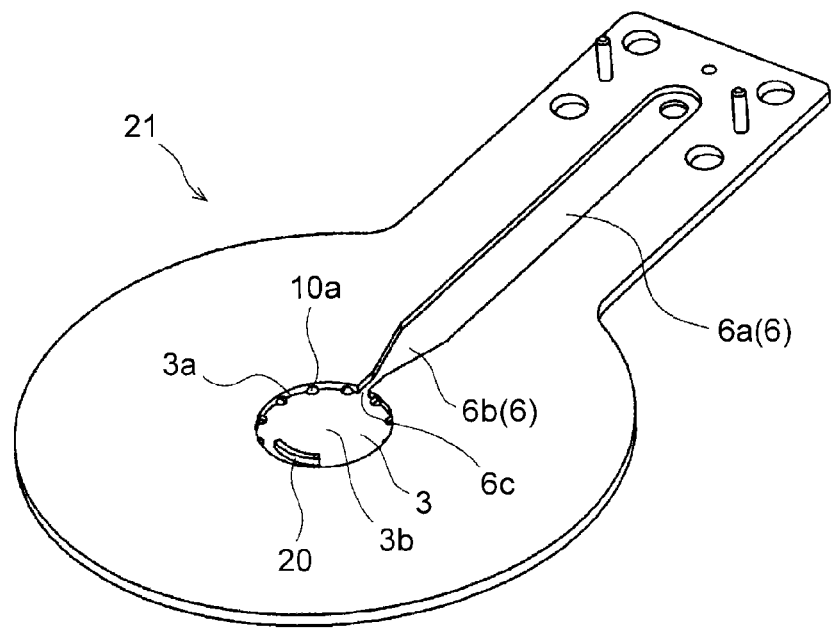
FIG. 5 is a perspective view of a first modified example of the suction holding plate.

As shown in FIG. 5, in a suction holding plate 21, an arcuate projection 20 that is apart from the peripheral wall surface 3a and extends along the peripheral wall surface 3a is provided on the bottom surface 3b of the circular chamber 3. This projection 20 is arranged in a manner to face the outlet 6c of the gas supply groove 6 and not to cover the inlets 10a of the gas discharge grooves 10, which are arranged at a position away from the outlet 6c. In this case, the air that is discharged from the outlet 6c does not directly flow into the inlets 10a at the positions away from the outlet 6c. Furthermore, the air that is discharged from the outlet 6c can equally be distributed in the chamber 3. Accordingly, it is possible by adopting the projection 20 to improve uniformity of a flow rate of the gas that is discharged from the gas discharge grooves 10. Such a projection 20 is especially effective when a flow velocity of the air that is discharged from the outlet 6c of the gas supply groove 6 is high.

Figure 6:
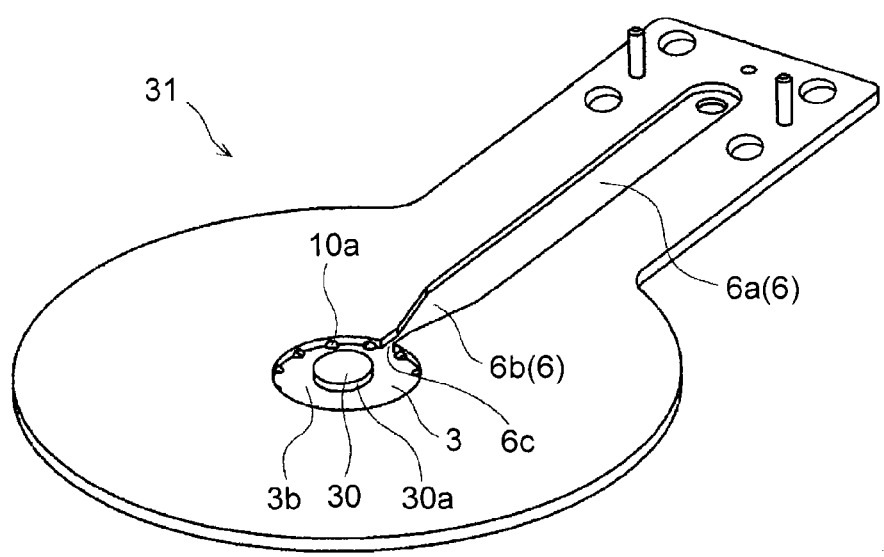
FIG. 6 is a perspective view of a second modified example of the suction holding plate.

As shown in FIG. 6, in a suction holding plate 31, a column-shaped projection 30 is provided on the center of the bottom surface 3b of the circular chamber 3. In this case, the air discharged from the outlet 6c flows along a peripheral surface 30a of the projection 30. Thus, the pressure loss in the chamber 3 can be reduced while uniformity of pressure distribution in the chamber 3 can be improved. Therefore, it is possible by adopting the projection 30 to improve the uniformity of the flow rate of the gas that is discharged from the gas discharge grooves 10. Such a projection 30 is especially effective when the flow velocity of the air that is discharged from the outlet 6c of the gas supply groove 6 is high.

Figure 7:
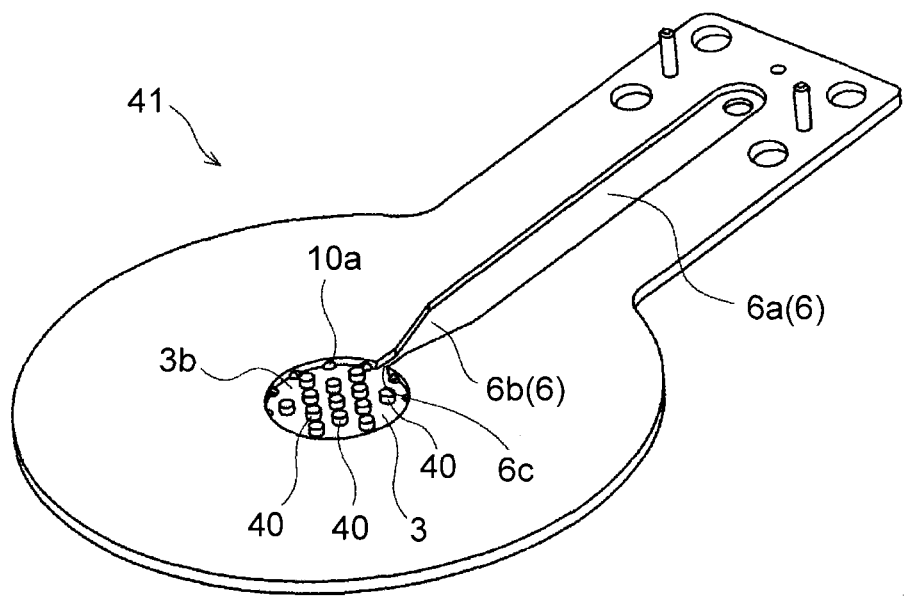
FIG. 7 is a perspective view of a third modified example of the suction holding plate.

As shown in FIG. 7, in a suction holding plate 41, a column-shaped projection 40 is provided and uniformly arranged in a substantially whole area of the bottom surface 3b of the circular chamber 3. As a result of such a configuration, the air discharged from the outlet 6c is stirred by the projection 40. Thus, the uniformity of the pressure distribution in the chamber 3 can be improved. Therefore, it is possible by adopting the projection 40 to improve the uniformity of the flow rate of the gas that is discharged from the gas discharge grooves 10. Such a projection 40 is especially effective when the flow velocity of the air that is discharged from the outlet 6c of the gas supply groove 6 is high.

Figure 8:
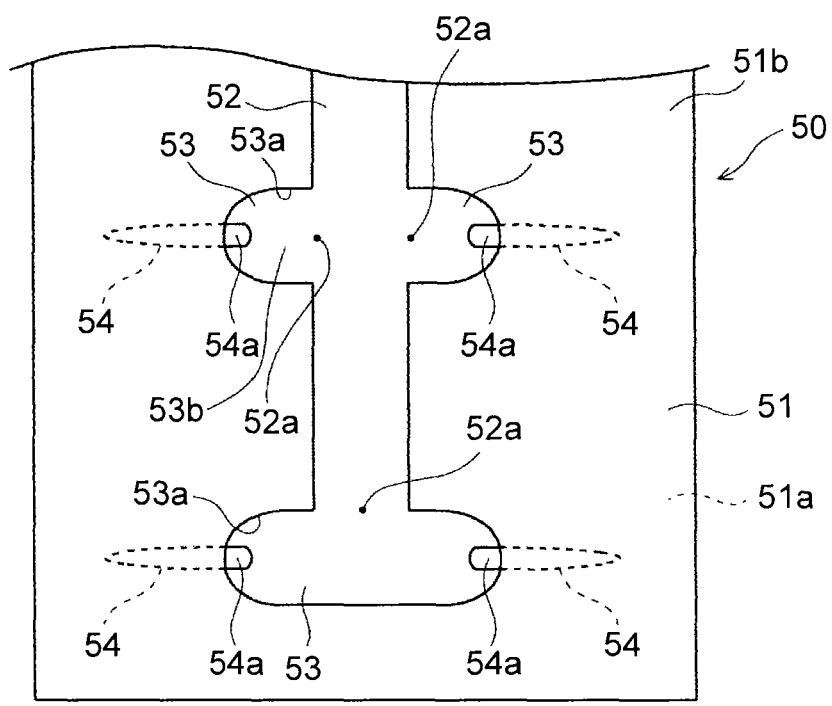
FIG. 8 is a plan view of another embodiment of the non-contact transfer hand according to the invention.

As shown in FIG. 8, on a non-suction surface 51b side of a suction holding plate 51, a hand 50 according to another embodiment is provided with: a gas supply groove 52 that extends linearly; and a chamber 53 that communicates with outlets 52a that are arranged in the middle and a downstream end of the gas supply groove 52. On a suction surface 51a side of the suction holding plate 51, the hand is provided with linear gas discharge grooves 54. Each of the linear gas discharge grooves 54 extends from an entry 54a and is formed across a peripheral wall surface 53a and a bottom surface 53b of the chamber 53. Then, each of the gas discharge grooves 54 extends perpendicularly with respect to the gas supply groove 52. The gas discharge grooves 54 extend parallel to each other. It should be noted that a plate-shaped lid portion, which is not shown, is fixed to the non-suction surface 51b.

What is claimed is:

1. A non-contact transfer hand comprising:
a suction holding plate that is a single plate having a flat-shaped suction surface, a non-suction surface, and a chamber, the suction surface and the non-suction surface being opposite sides of the single plate; and
a lid portion, wherein
the suction surface has a gas discharge groove,
the non-suction surface has a gas supply groove that has a gas introduction port,
the chamber communicates with an end of the gas supply groove,
the gas supply groove is configured to supply gas front the gas introduction port toward the chamber,
a wall surface of the chamber has an inlet of the gas discharge groove,
the gas discharge groove communicates with the chamber via the inlet, and is configured to discharge the gas in a direction apart from the chamber, and
the lid portion is fixed on the non-suction surface to cover the gas supply groove and the chamber.

2. The non-contact transfer hand according to claim 1 wherein
the gas discharge groove is constituted by a plurality of gas discharge grooves, and
the gas discharge grooves are arranged symmetrically with respect to a plane perpendicular to the suction surface.

3. The non-contact transfer hand according to claim 2, wherein
the gas supply grooves have a linear shape,
the chamber is provided at a center of the suction surface, and
the gas discharge grooves extend radially and linearly from the chamber.

4. The non-contact transfer hand according to claim 1, wherein
the gas supply groove has a main groove and a width reduction groove,
the main groove has a constant width and extends linearly,
the width reduction groove extends from an end of the main groove to the chamber, and
a groove width of the width reduction groove is gradually reduced toward the chamber.

5. The non-contact transfer hand according to claim 1, further comprising
   a projection that is provided on a bottom surface of the chamber.
6. The non-contact transfer hand according to claim 5, wherein
   at least a part of the projection is opposite to an outlet of the gas supply groove.
7. The non-contact transfer hand according to claim 1, wherein
   the chamber is circular and the wall surface is a circular peripheral wall surface, and
   the gas discharge groove has a recessed shape and becomes shallower and tapered radially outward from the inlet.
8. The non-contact transfer and according to claim 1, further comprising
   a workpiece holding claw fixed to the suction holding plate, the workpiece holding claw being L-shaped and including a fixed portion fixed to the non-suction surface and a claw portion.
9. The non-contact transfer hand according to claim 1, wherein
   the gas discharge groove and the gas supply groove do not cross each other in a plan view.

* * * * *